United States Patent [19]

Holm

[11] 4,439,882
[45] Apr. 3, 1984

[54] DEVICE FOR CLEANING OBJECTS BY SCRUBBING IN THE PRESENCE OF SOLVENT

[75] Inventor: Kurt A. Holm, Skoghall, Sweden
[73] Assignee: Bycasin AB, Karlstad, Sweden
[21] Appl. No.: 379,031
[22] Filed: May 17, 1982
[51] Int. Cl.³ .............................................. B08B 1/02
[52] U.S. Cl. ...................................................... 15/77
[58] Field of Search .......................... 15/21 D, 77, 102; 29/81 H; 51/22, 23

[56] References Cited

U.S. PATENT DOCUMENTS

| | | | |
|---|---|---|---|
| 1,817,332 | 8/1931 | Worrall | 15/77 |
| 3,928,064 | 12/1975 | Holm | 15/77 |
| 3,938,214 | 2/1976 | Hodsden | 15/102 |
| 4,129,919 | 12/1978 | Fitch | 15/77 |

FOREIGN PATENT DOCUMENTS

| | | | |
|---|---|---|---|
| 1134990 | 12/1956 | France | 15/77 |
| 547200 | 8/1942 | United Kingdom | 15/77 |

*Primary Examiner*—Edward L. Roberts
*Attorney, Agent, or Firm*—Fleit, Jacobson, Cohn & Price

[57] ABSTRACT

A roller brush (9) is horizontally arranged in a solvent vessel (7). The essentially vertical portions of the lateral surface of the brush (9) are sealingly surrounded by contour plates (11,12). The contour plates are sealingly connected to a cover (14–16) which is in turn sealingly connected to the edge of the vessel. The brush (9) is partially immersed in the solvent and is driven for rotation. The contour plate (11) which is conjoined to the upwardly moving peripheral portion of the rotating brush (9), extends down into the solvent so that the brush, in cooperation with the contour plate (11), pumps solvent up to the scrubbing area as the brush rotates. A conveyor path (1) for objects to be cleaned extends through the upper peripheral portion of the brush. The bristles of the brush (9) form, in cooperation with the cover (14–16) and the contour plates (11,12), a seal between the interior of the vessel and the surroundings of the vessel.

7 Claims, 4 Drawing Figures

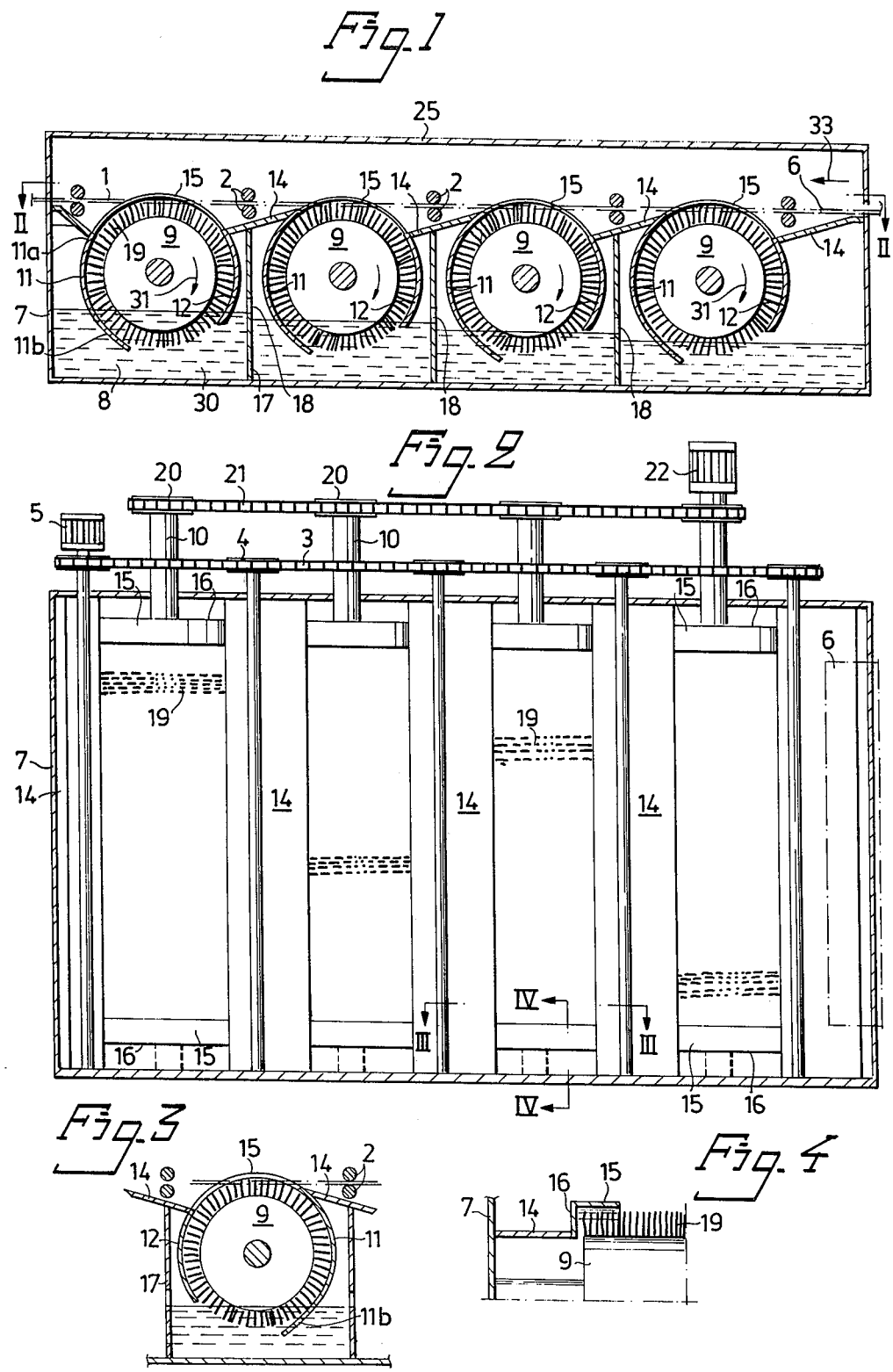

DEVICE FOR CLEANING OBJECTS BY SCRUBBING IN THE PRESENCE OF SOLVENT

THE FIELD OF TECHNOLOGY

The invention relates to a device for cleaning objects by scrubbing in the presence of solvent, of the type comprising a conveyor path for objects, means for driving the objects along the conveyor path, a vessel containing solvent, at least one roller brush which is rotatably mounted in the vessel, is arranged essentially horizontally with its axis transverse to the direction of the conveyor path, and is partially immersed in the solvent, the conveyor path being in contact with the upper peripheral portion of the brush, means for rotating the brushes and means for applying solvent at the brush to the object.

BACKGROUND

Devices of the type described are previously known and are usually used for cleaning circuit boards on which electronic components are or have been mounted, for example by soldering, with the device serving to guarantee satisfactory solder connections and to remove flux residue and the like.

Previously known devices have proved to function rather well with regard to cleaning effect, but problems have arisen because solvent evaporates from the vessel and contaminates the atmosphere. This both presents a health hazard for operators in the workroom, and involves a significant loss of solvent. To prevent the solvent from contaminating the atmosphere of the workroom, it is usual to draw off the air above the device and lead such solvent-saturated air through a charcoal filter, for example. Such charcoal filters are, however, costly both as regards construction and operation, especially in view of the fact that devices of the present type are not normally used continuously but must in any case be kept in readiness, and the fact that the filters must be large in size. Even if it is possible to recover the major portion of the solvent from the charcoal filter, relatively high costs are involved.

PURPOSE

One purpose of the invention is to achieve a device of the type described by way of introduction, which provides a reduction of solvent loss from the device when the device is standing still, while still keeping the device immediately ready for work. A further purpose of the invention is to achieve a device by means of which solvent can be simply and automatically applied to objects at the scrubbing location when the device is in operation. A further purpose of the invention is to achieve a device which reduces recontamination of solvent when there are sequentially arranged brushes in the device.

DISCLOSURE OF THE INVENTION

The invention enamates from a device comprising a conveyor path for objects to be cleaned, means for driving the objects along the path, a vessel containing solvent, at least one roller brush which is rotatably mounted in the vessel, is arranged essentially horizontally with its axis transverse to the direction of the conveyor path, and which is partially immersed in the solvent, said conveyor path being in contact with the upper peripheral portion of the brush, means for rotating the brushes and means for applying solvent to the object at the brush. Starting from such a device, the invention is characterized in that a first plate is conjoined to the contour of the upwardly moving peripheral portion of the brush, that the lower part of said first plate extends down into the solvent, and that a cover which is sealingly joined to the walls of the vessel has a cover plate with an opening, the edge of which is in sealing association with the first plate, the downwardly moving peripheral portion of the rotating brush, and the end portions of the brush, whereby the brush in cooperation with the cover forms a seal which reduces solvent evaporation from the vessel, and whereby the brush, in cooperation with the first plate, pumps up solvent during rotation to the area of contact between the conveyor path and the brush.

In a preferred embodiment, the cover comprises a shield which is conjoined to the contour of the upper peripheral portion of the brush at each end of the brush, and an end plate which covers the shield outside the respective end of the brush, the end plate and the shield being sealingly connected to each other and to the cover plate. Furthermore, a second plate can be arranged conjoined to the contour of the downwardly moving portion of the rotating brush essentially along the entire length of the brush, said second plate being sealingly joined to the cover plate. The bristles of the brush, in cooperation with the first and second plates and the shield will thereby provide a gap seal of substantial length.

Especially when the device comprises a number of parallel brushes arranged to rotate in the same direction, the cover plate can be disposed so as to be inclined downwards in the area between adjacent brushes in the direction towards the downwardly moving peripheral portion of the rotating brush. This assures that solvent which has been pumped up by one brush to the scrubbing area, will be for the most part at least returned to the downwardly moving peripheral portion of this brush.

When the device comprises a number of parallel brushes, the vessel can be divided into a number of solvent containers, each of which containing at least one brush. These containers are then arranged to communicate with each other via overfall so that the solvent in the vessel flows via the overfalls in a direction opposite to the direction of movement of the objects, the drive means of the brushes being arranged to impart a rotation to the brushes so that the upper peripheral portions of the brushes move in a direction counter to the direction of movement of the objects. Thus, splashing of contaminated solvent and contaminants from a brush located downstream in the device will be directed towards a brush located upstream. The transfer of contaminants between containers in the direction of conveyance of the objects is thereby avoided. The container farthest upstream in the conveyance direction and containing the dirtiest solvent, can be connected to a distilling apparatus for purifying the solvent which can then possibly be returned to the container which is located farthest downstream in the object conveyance direction.

The inventive machine is, like prior machines intended to be connected to some charcoal filter via some suction hood, in order to draw off solvent contaminated air above the machine. In comparison with prior machines the solvent evaporation from the inventive machine is low when the machine is inoperative, and the size of the filters can be dimensioned accordingly. Prior attempts to reduce the evaporation during inoperative condition has involved the use of a lid, which was placed over the machine vessel and removed when the machine was to be used. Apart from the fact that the operators tend to forget to place the lid over the vessel, the solvent vapor collects under the lid, and the removal of the lid brought about that a cloud of solvent vapor suddenly was released, which the fans cannot entirely draw off. The alternative was, of course, to use high capacity fans, but that brings about other problems and costs.

In the inventive machine, the fans can be arranged to run with higher capacity when the brushes run than when they stand still.

It is appreciated that the invention relates to the conditions during a workday, when the machine is used on and off, and all the time has to be ready for immediate use without the necessity of removing a separate lid and replacing it afterwards.

During e.g. nights, the solvent can be removed and stored in a closed container, and during that time, the filter can be regenerated.

The invention defined in the attached claims will be described in more detail in the following in the form of an example with reference to the accompanying drawing.

DRAWING

FIG. 1 shows schematically a vertical section through a device according to the invention.

FIG. 2 shows a horizontal view of the device according to FIG. 1.

FIGS. 3 and 4 show sections taken along the line III—III and IV—IV, respectively, in FIG. 2.

EMBODIMENT EXAMPLE

FIG. 1 shows a vessel 7 containing solvent 8. The vessel 7 is divided by means of bulkheads 17 into a number of containers 30. The bulkheads 17 contain flow openings 18 which are arranged as overfalls so that the solvent 8 flows from left to right in FIG. 1.

Each container 30 contains a roller brush 9 which is arranged essentially horizontally and partially immersed in the solvent 8. The brushes 9 are arranged essentially parallel to each other and, as revealed in FIG. 2, each can have an axle 10 with a sprocket wheel 20, the sprocket wheels 20 being coupled to each other by means of a chain 21 so that a motor 22 can drive all the brushes 9. Preferably, the brushes 9 are arranged to rotate in the direction indicated by the arrows 31.

A number of roller pairs 2 define a conveyor path 1 for the objects 6 to be cleaned. The conveyor path 1 extends in contact with the upper portions of the bristles 19 of the brushes 9. The objects 6 are suitably arranged to be driven in the direction of the arrow 33. For this purpose, the upper roller of each roller pair 2 (as seen in FIG. 2) can be provided with a sprocket wheel 4, and a chain 3 extend around the sprocket wheels 4 so that a motor 5 can drive all the rollers 2 to achieve the direction of conveyance 33.

Plates 11 and 12 are conjoined to the contours of the brushes along substantially the entire length of the brushes. The plates 11 and 12 are conjoined to the bristles 19 of the brushes primarily above the level of the solvent 8. The plates 11 and 12 are sealingly connected to a cover plate 14, which is in turn sealingly fixed to the edge of the vessel 7. Each end of each brush 9 has a hood 15, 16 (see FIGS. 3 and 4). The hoods 15,16 comprise both a curved sheet metal strip 15 which is conjoined to the upper peripheral portions of the bristles 19 of the brush 9 and are sealingly connected at their short ends to the cover plate 14, and an end plate 16 which sealingly connects one longside of the strip 15 to the cover plate 14.

The bristles 19 of the brush 9 will thereby form in cooperation with the plates 11,12 and 15 a seal between the interior of the vessel and the surroundings of the vessel. This will result in a substantial reduction of the solvent loss from the device when the device is standing still.

As can be seen from FIG. 1, the lower portion 11b of the plate 11 extends down into the solvent 8. The plate end 11b departs somewhat from the bristles 19 of the brush 9 at its free end. The upper portion 11a of the plate 11 preferably extends up to a level slightly below the conveyor path 1. When the brushes 9 rotate in the direction 31, the bristles 19 of the brushes 9, through cooperation with the plates 11 will be able to pump up solvent 8 to the respective scrubbing area.

With the rotational directions 31 and the conveyor direction 33 selected, any splashing of solvent and contaminants from a scrubbing area will be thrown to the right in FIG. 1. This avoids contamination of the brush and solvent in the container 30 immediately to the left, the solvent therein being cleaner than the solvent in the container immediately to the right, because of the arrangement with overfalls 18 between the containers. The cover plates 14 are inclined downwards towards the plate 12 to facilitate return of the solvent to the vessel.

Although not shown, the container 30 farthest to the right in FIG. 1 can be connected to a pump and a distilling apparatus to clean the solvent which can then be returned to the container 30 farthest to the left in FIG. 1.

The seal illustrated in FIGS. 3 and 4 against the end portions of the brushes can be replaced with a straight edge or a straight brush which is fixed to the cover plate 14 and which sealingly rubs against the end surface of the brush.

The invention has been described above in the form of a non-limiting example, and it should be cleared that the illustrated embodiment can be modified in a number of ways within the scope of the attached claims. For example, it is possible to eliminate the plate 12 and instead allow the corresponding edge of the cover plate 14 to provide the seal against the brush.

I claim:

1. Device for cleaning objects by scrubbing in the presence of solvent, comprising: a conveyor path (1) for the objects; means (2-5) for driving the objects along the conveyor path; a vessel (7) containing solvent; at least two roller brushes (9), rotatably mounted in the vessel, which are arranged essentially horizontally with their axes transverse to the direction of the conveyor path (1) and which are partially immersed in the solvent, the conveyor path being in contact with the upper peripheral portion of each brush; means (20-22) for rotating the brushes; and a first plate which is conjoined to the contour of the upwardly moving peripheral portion of each rotating brush (9); the lower portion (11b) of the first plate (11) extending down into the solvent so that a brush, in cooperation with the first plate (11), during rotation pumps up solvent to the area of contact between the conveyor path and the brush, characterized in that a cover (14–16) is sealingly joined to the walls of the vessel (7); that the cover has an opening for each brush (9); and that the edge of each opening is in sealing association with the first plate, the downwardly moving peripheral portion of the rotating brush (9) and the end portions of the brush, whereby each brush forms a seal for its opening in the cover.

2. Device according to claim 1, characterized in that the cover (14–16) includes a hood portion (15, 16) comprising a curved plate portion (15) which extends in conjunction with the edge region of the upper peripheral portion of each brush (9) at both ends of the brush, and an end plate (16) outside the respective end of each brush (9), and that the end plate (16) and the curved plate portion (15) are sealingly connected to each other.

3. Device according to claim 1, characterized in that a second plate (12) is conjoined to the contour of the downwardly moving peripheral portion of each rotating brush along essentially the entire length of the brush, and that the second plate (12) is sealingly connected to the cover.

4. Device according to claim 2, characterized in that a second plate (12) is conjoined to the contour of the downwardly moving peripheral portion of each rotating brush along essentially the entire length of the brush, and that the second plate (12) is sealingly connected to the cover.

5. Device according to one of claims 1, 2, 3, or 4, characterized in that the cover (14) is arranged, in the vicinity of a brush (9) to be inclined downwards towards the downwardly moving peripheral portion of the rotating brush.

6. Device according to one of claim 1, characterized in that the vessel is divided into a plurality of solvent containers (30) each containing at least one brush (9), that the containers (30) are in communication with each other via overfalls (18), and that the solvent is arranged to flow through the vessel (7) via the overfalls (18) in a direction opposite to the direction (33) of the conveyor path (1).

7. Device according to one of claim 1, characterized in that the rotating means (20–22) is disposed to effect a unidirectional rotation of the brushes, and that the drive means (2–5) is disposed to drive the objects in a direction counter to the direction of movement of the exposed peripheral portions of the rotating brushes.

* * * * *